US008665605B2

(12) United States Patent
Chen et al.

(10) Patent No.: US 8,665,605 B2
(45) Date of Patent: Mar. 4, 2014

(54) SUBSTRATE STRUCTURE AND PACKAGE STRUCTURE USING THE SAME

(75) Inventors: Kuo-Hua Chen, Kaohsiung County (TW); Ming-Chiang Lee, Kaohsiung (TW); Tsung-Hsun Lee, Kaohsiung (KR); Chen-Chuan Fan, Dali (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 308 days.

(21) Appl. No.: 12/552,846

(22) Filed: Sep. 2, 2009

(65) Prior Publication Data

US 2010/0206622 A1 Aug. 19, 2010

Related U.S. Application Data

(60) Provisional application No. 61/152,987, filed on Feb. 17, 2009.

(30) Foreign Application Priority Data

Apr. 8, 2009 (TW) .............................. 98111726 A

(51) Int. Cl.
*H05K 7/00* (2006.01)

(52) U.S. Cl.
USPC ........... 361/777; 361/784; 257/690; 257/691; 257/700; 257/737; 257/787; 438/125; 438/692

(58) Field of Classification Search
USPC .......... 361/777, 784; 257/690, 691, 700, 737, 257/787; 438/125, 692
See application file for complete search history.

(56) References Cited

U.S. PATENT DOCUMENTS

| 5,805,865 | A | * | 9/1998 | Mimura et al. | 703/28 |
| 5,948,573 | A | * | 9/1999 | Takahashi | 430/5 |
| 6,171,976 | B1 | * | 1/2001 | Cheng | 438/760 |
| 6,373,544 | B1 | * | 4/2002 | Hirabayashi | 349/149 |
| 6,380,633 | B1 | * | 4/2002 | Tsai | 257/778 |
| 6,384,464 | B1 | * | 5/2002 | Shin | 257/503 |
| 6,486,554 | B2 | * | 11/2002 | Johnson | 257/738 |
| 6,503,667 | B1 | * | 1/2003 | Kobayashi | 430/5 |
| 6,504,239 | B1 | * | 1/2003 | Yamada | 257/678 |
| 6,507,100 | B1 | | 1/2003 | Valluri et al. | |
| 6,528,889 | B1 | * | 3/2003 | Matsuhira et al. | 257/778 |
| 6,534,852 | B1 | * | 3/2003 | Lin et al. | 257/691 |
| 6,553,274 | B1 | * | 4/2003 | Motoyama et al. | 700/121 |
| 6,570,246 | B1 | * | 5/2003 | Lee et al. | 257/690 |
| 6,580,620 | B1 | * | 6/2003 | Kim | 361/784 |
| 6,661,088 | B1 | * | 12/2003 | Yoda et al. | 257/700 |
| 6,777,337 | B2 | * | 8/2004 | Yasui et al. | 438/692 |
| 7,755,176 | B1 | * | 7/2010 | St. Amand et al. | 257/678 |
| 7,880,258 | B2 | * | 2/2011 | Bui et al. | 257/465 |
| 2001/0005619 | A1 | * | 6/2001 | Hasebe et al. | 438/487 |
| 2001/0022639 | A1 | * | 9/2001 | Kwak et al. | 349/122 |
| 2001/0038154 | A1 | * | 11/2001 | Arai et al. | 257/797 |
| 2001/0045562 | A1 | * | 11/2001 | Uemura et al. | 257/79 |

(Continued)

*Primary Examiner* — Xiaoliang Chen

(74) *Attorney, Agent, or Firm* — Muncy, Geissler, Olds & Lowe, PLLC

(57) ABSTRACT

A substrate structure and a package structure using the same are provided. The substrate structure includes a number of traces, a substrate core and a number of first metal tiles. The substrate core has a first surface and a second surface opposite to the first surface. The first metal tiles are disposed on one of the first surface and the second surface, the minimum pitch between adjacent two of the first metal tiles is the minimum process pitch.

17 Claims, 3 Drawing Sheets

(56) References Cited

U.S. PATENT DOCUMENTS

| | | | |
|---|---|---|---|
| 2002/0024046 A1* | 2/2002 | Corbett et al. | 257/48 |
| 2002/0056906 A1* | 5/2002 | Kajiwara et al. | 257/697 |
| 2002/0058412 A1* | 5/2002 | Ono et al. | 438/678 |
| 2002/0061608 A1* | 5/2002 | Kuroda et al. | 438/129 |
| 2002/0061665 A1* | 5/2002 | Batinovich | 439/71 |
| 2002/0063335 A1* | 5/2002 | Ozawa et al. | 257/758 |
| 2002/0074650 A1* | 6/2002 | Takahashi et al. | 257/723 |
| 2002/0097367 A1* | 7/2002 | Hirabayashi | 349/149 |
| 2002/0130383 A1* | 9/2002 | Nakamura | 257/506 |
| 2002/0140108 A1* | 10/2002 | Johnson | 257/778 |
| 2003/0015342 A1* | 1/2003 | Sakamoto et al. | 174/250 |
| 2003/0049945 A1* | 3/2003 | Hyoto et al. | 438/926 |
| 2003/0132768 A1* | 7/2003 | Van Horn et al. | 324/754 |
| 2003/0151047 A1* | 8/2003 | Corbett et al. | 257/48 |
| 2003/0205797 A1* | 11/2003 | Takahashi et al. | 257/678 |
| 2003/0222260 A1* | 12/2003 | Tone et al. | 257/48 |
| 2004/0063038 A1* | 4/2004 | Shin et al. | 430/311 |
| 2004/0101996 A1* | 5/2004 | Hyoto et al. | 438/128 |
| 2004/0152243 A1* | 8/2004 | Kuroda et al. | 438/129 |
| 2004/0161885 A1* | 8/2004 | Kim et al. | 438/197 |
| 2004/0164428 A1* | 8/2004 | Takahashi et al. | 257/780 |
| 2004/0173903 A1* | 9/2004 | Yang et al. | 257/738 |
| 2004/0174092 A1* | 9/2004 | Iwata | 310/324 |
| 2004/0231887 A1* | 11/2004 | Van Horn et al. | 174/262 |
| 2005/0127535 A1* | 6/2005 | Takahashi et al. | 257/787 |
| 2005/0128416 A1* | 6/2005 | Hashimoto | 349/149 |
| 2005/0189633 A1* | 9/2005 | Wang et al. | 257/678 |
| 2005/0224969 A1* | 10/2005 | Wu | 257/737 |
| 2005/0263885 A1* | 12/2005 | Nakamura et al. | 257/737 |
| 2005/0266169 A1* | 12/2005 | Seki et al. | 427/470 |
| 2006/0024861 A1* | 2/2006 | Cordes et al. | 438/106 |
| 2006/0035465 A1* | 2/2006 | Choi et al. | 438/692 |
| 2006/0043593 A1* | 3/2006 | Mori et al. | 257/758 |
| 2006/0091425 A1* | 5/2006 | Sunairi | 257/208 |
| 2006/0202282 A1* | 9/2006 | Kuroda et al. | 257/374 |
| 2007/0001285 A1* | 1/2007 | Takiar et al. | 257/700 |
| 2007/0004094 A1* | 1/2007 | Takiar et al. | 438/125 |
| 2007/0004097 A1* | 1/2007 | Yu et al. | 438/129 |
| 2007/0222080 A1* | 9/2007 | Kuroda et al. | 257/758 |
| 2007/0243523 A1* | 10/2007 | Ionescu-Zanetti et al. | 435/4 |
| 2007/0252272 A1* | 11/2007 | Yano et al. | 257/734 |
| 2007/0256858 A1* | 11/2007 | Kariya et al. | 174/260 |
| 2007/0290302 A1* | 12/2007 | Nakagawa et al. | 257/668 |
| 2007/0295984 A1* | 12/2007 | Ono et al. | 257/103 |
| 2008/0024415 A1* | 1/2008 | Jung et al. | 345/92 |
| 2008/0030209 A1* | 2/2008 | Cordes et al. | 324/755 |
| 2008/0081455 A1* | 4/2008 | Yu et al. | 438/612 |
| 2008/0124910 A1* | 5/2008 | Hou | 438/612 |
| 2008/0211056 A1* | 9/2008 | Kuroda et al. | 257/510 |
| 2008/0217735 A1* | 9/2008 | Chen et al. | 257/529 |
| 2008/0236876 A1* | 10/2008 | Kodama et al. | 174/260 |
| 2009/0001604 A1* | 1/2009 | Tanaka et al. | 257/778 |
| 2009/0008803 A1* | 1/2009 | Hou | 257/786 |
| 2009/0061362 A1* | 3/2009 | Taoka et al. | 430/319 |
| 2009/0084594 A1* | 4/2009 | Kariya et al. | 174/260 |
| 2009/0108448 A1* | 4/2009 | Lee | 257/738 |
| 2009/0115072 A1* | 5/2009 | Rhyner et al. | 257/778 |
| 2009/0146310 A1* | 6/2009 | Ohno et al. | 257/773 |
| 2009/0149014 A1* | 6/2009 | Nie et al. | 438/613 |
| 2009/0294826 A1* | 12/2009 | Hong | 257/316 |
| 2009/0315854 A1* | 12/2009 | Matsuo | 345/174 |
| 2011/0045582 A1* | 2/2011 | Lee et al. | 435/307.1 |

* cited by examiner

SUBSTRATE STRUCTURE AND PACKAGE STRUCTURE USING THE SAME

This application claims the benefit of U.S. provisional application Ser. No. 61/152,987, filed Feb. 17, 2009, the subject matter of which is incorporated herein by reference, and claims the benefit of Taiwan application Serial No. 98111726, filed Apr. 8, 2009, the subject matter of which is incorporated herein by reference.

BACKGROUND OF THE INVENTION

1. Field of the Invention

The invention relates in general to a substrate structure and a package structure using the same, and more particularly to a substrate structure having metal tiles for increasing structural strength and a package structure using the same.

2. Description of the Related Art

The two opposite surfaces of the substrate structure normally have different proportions in metal structure. For example, one surface of the substrate structure has a number of traces, and the opposite surface has a number of connecting pads connected to a number of conductive solder balls. As the two opposite surfaces of the substrate structure may differ widely in terms of the proportions of traces and connecting pads, the proportions of the metal structure of the two opposite surfaces also differ widely. Further due to the difference in the coefficient of thermal expansion and in the metal structure, the substrate structure operating in a high temperature will generate stress and become warped. Such deformation may damage the substrate structure. For example, elements on the substrate structure such as traces, conductive solder balls and chips may break, crack, or come off.

An ordinary practice to reduce the deformation is achieved by adding a metal mesh layer such as a copper mesh layer on the two opposite surfaces of the substrate structure, so that the proportions of the metal structure between the two opposite surfaces of the substrate structure become closer to each other. Referring to FIG. 1, a conventional substrate structure is shown. A surface 102 of the substrate structure 100 has a number of traces 110 and a number of metal mesh layers 104. The opposite surface (not illustrated) of the substrate structure 100 also has a number of metal mesh layers. With the disposition of the metal mesh layers, the proportions of the metal structure in the two opposite surfaces of the substrate structure become closer to each other and the deformation is reduced accordingly.

Referring to FIG. 2, the manufacturing of a metal mesh layer of FIG. 1 is shown. The shading region 112 of the mask 106 corresponds to the metal mesh wires 124 of the metal mesh layers 104 of FIG. 1. The metal mesh wire 124 is adjacent to the trace 110. The transparent region 108 corresponds to the hollowed portions 114 of the metal mesh layers 104 of FIG. 1. After portions of the photo-resist layer 116 of the substrate 120 is exposed by the light L passed through the mask 106, the portions of the exposed photo-resist is removed through subsequent developing process. Then, in the subsequent etching process, the metal mesh layers 104 and the traces 110 are formed on the metal layer 122 by way of etching.

As indicated in FIG. 2, in order to make the mask 106 flat, during the exposing process, the mask 106 is pulled to the two ends in two opposite directions D1 and D2, and the mask 106 is thus extended, making the transparent region 108 and 118 become wider along the directions D1 and D2. The widths of the transparent region 108 and 118 make the light L1 passing through the transparent region 108 and 118 diffracted wider. Thus, the interval S1 between the traces 110 and the metal mesh wire 124 adjacent thereto becomes wider due to the extension of the mask and the expansion of scattered light. As the interval S1 becomes wider, the distribution range of the metal mesh layer 104 becomes smaller accordingly, and the control of the proportions of the metal structure between the two opposite surfaces of the substrate structure becomes more difficult.

SUMMARY OF THE INVENTION

The invention is directed to a substrate structure and a package structure using the same. A number of metal tiles are formed on a surface of the substrate structure, and the minimum pitch between the metal tiles can be taken as the minimum process pitch. Thus, the metal tiles have a higher distribution density and a wider distribution range, and this is conducive for increasing the structural strength of the substrate and controlling the metal structure proportions in the two opposite surfaces of the substrate structure. Moreover, the deformation occurring to the substrate structure and the package structure using the same when operating in a high temperature is largely reduced.

According to a first aspect of the present invention, a substrate structure is provided. The substrate structure includes a number of traces, a substrate and a number of first metal tiles. The substrate has a first surface and a second surface opposite to the first surface. The first metal tiles are disposed on one of the first surface and the second surface, the minimum pitch between adjacent two of the first metal tiles is the minimum process pitch.

According to a second aspect of the present invention, a package structure is provided. The package structure includes a substrate structure, a chip and a sealant. The substrate structure includes a number of traces, a substrate core and a number of first metal tiles. The substrate core has a first surface and a second surface opposite to the first surface. The first metal tiles are disposed on one of the first surface and the second surface. The minimum pitch between adjacent two of the first metal tiles is the minimum process pitch. The chip is disposed on the substrate structure and sealed up by a sealant.

The invention will become apparent from the following detailed description of the preferred but non-limiting embodiments. The following description is made with reference to the accompanying drawings.

DETAILED DESCRIPTION OF THE INVENTION

In the invention of the substrate structure and the package structure using the same, a number of metal tiles are formed on a surface of the substrate structure, and the minimum pitch between the metal tiles can be taken as the minimum process pitch of the substrate structure. Thus, the metal tiles have higher distribution density and wider distribution area, and this is conducive for increasing the structural strength of the substrate and controlling the metal structure proportions in the two opposite surfaces of the substrate structure. Moreover, the deformation occurring to the substrate structure when operating in a high temperature and to a package structure using the same is largely reduced.

Preferred embodiments are disclosed below for elaborating the invention. However, the following embodiments and accompanying drawings are for the purpose of elaboration only, not for limiting the scope of protection of the invention. Besides, secondary elements are omitted in the following embodiments to highlight the technical features of the invention.

Figure 3:
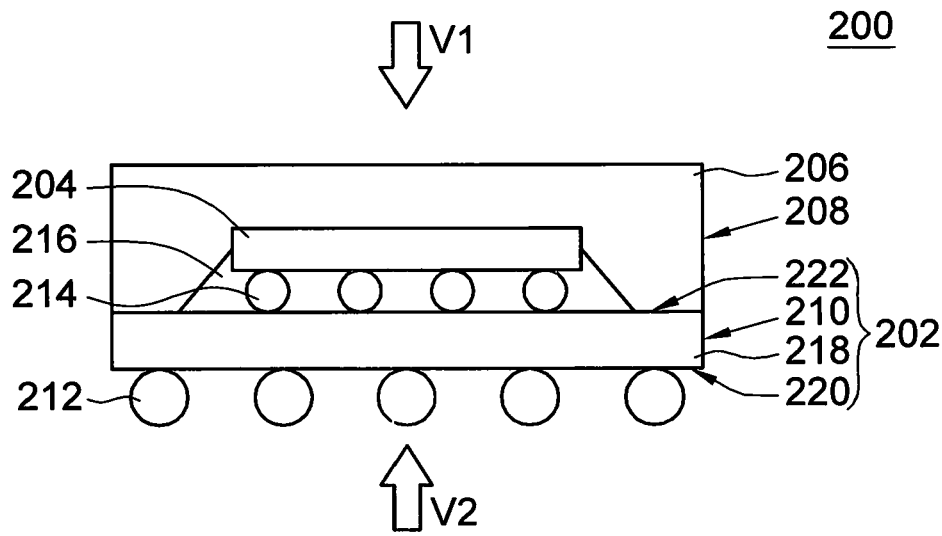
FIG. 3 shows a package structure according to a preferred embodiment of the invention.

Referring to FIG. 3, a package structure according to a preferred embodiment of the invention is shown. The package structure 200, such as a flip-chip CSP (FCCSP), includes a substrate structure 202, a chip 204, a sealant 206, a number of first conductive portions 212, a number of second conductive portions 214 and an underfill 216. The underfill 216 seals the second conductive portions 214. The sealant 206 is used for sealing the chip 204 and the underfill 216. The peripheral side 208 of the sealant 206 is substantially aligned with the peripheral side 210 of the substrate structure 202.

The chip 204, such as a flip chip, is electrically connected to the substrate structure 202 through the second conductive portions 214. The first conductive portions 212 are disposed on a second surface 220 of the substrate structure 202 for electrically connecting with an electronic element such as a circuit board (not illustrated). Besides, the substrate core 218 further has a first surface 222 opposite to the second surface 220.

Figure 4:
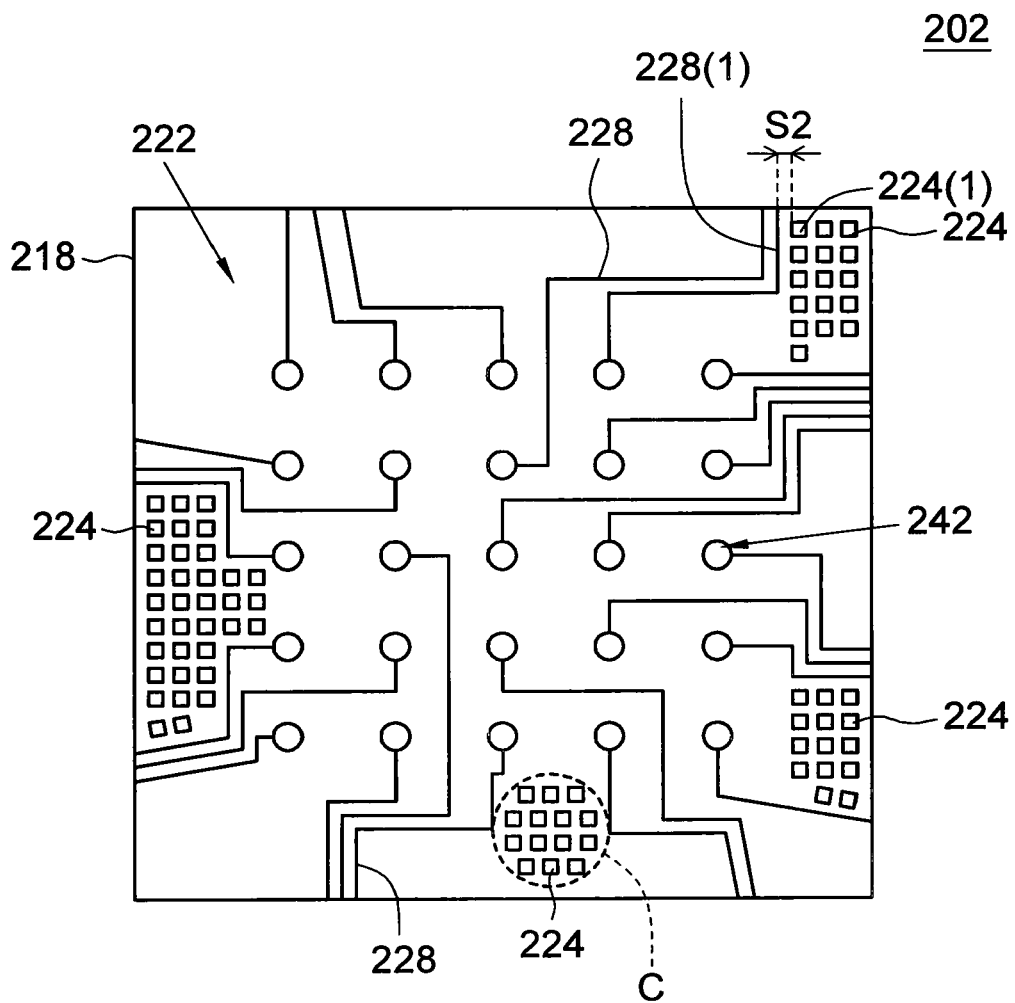
FIG. 4 shows a substrate structure viewed along the direction V1 of FIG. 3.
Figure 5:
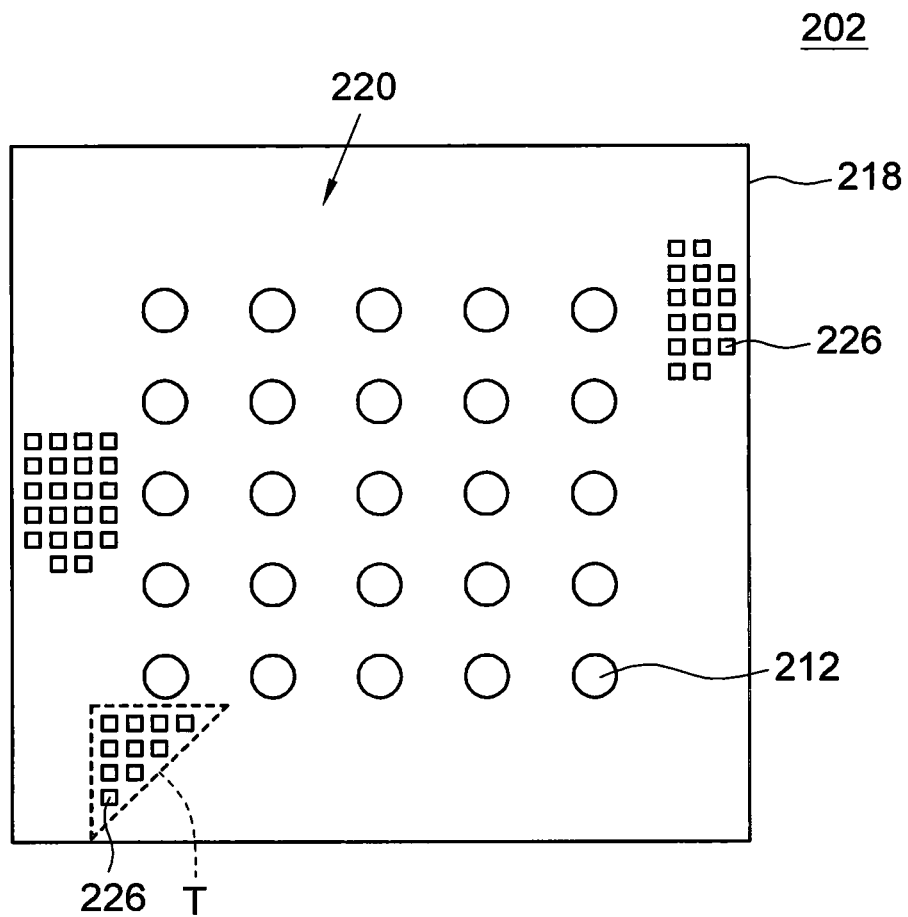
FIG. 5 shows a substrate structure viewed along the direction V2 of FIG. 3.

Referring to both FIG. 4 and FIG. 5. FIG. 4 shows a substrate structure viewed along the direction V1 of FIG. 3. FIG. 5 shows a substrate structure viewed along the direction V2 of FIG. 3. As indicated in FIG. 4, the substrate structure 202 further includes a number of traces 228, a number of first metal tiles 224, a number of second metal tiles 226 (illustrated in FIG. 5) and a number of through holes 242. In the present embodiment of the invention, the first metal tiles 224 and the second metal tiles 226 are made from copper. The traces 228 are used for providing electrical connection. The first metal tiles 224 and the second metal tiles 226 are only used for increasing structural strength of the substrate structure 202; they are not used for providing electrical connection.

In the present embodiment of the invention, the first metal tiles 224 and the second metal tiles 226 are both in the shape of a rectangle such as a square whose side length is 100 μm. However, the above exemplification is not for limiting the scope of protection of the invention. For example, the first metal tiles 224 and the second metal tiles 226 can also be exemplified by a circle or a polygon. Moreover, the dimensions of the first metal tiles 224 and that of the second metal tiles 226 are determined according to actual needs and are not restricted by the exemplifications of the present embodiment of the invention.

The first metal tiles 224 are disposed on the first surface 222, and the second metal tiles 226 are disposed on the second surface 220 (the second metal tiles 226 and the second surface 220 are illustrated in FIG. 5). Generally speaking, the superior the process capability, the smaller the pitch between the traces 228, and the overall size of the package structure is thus reduced. In the present embodiment of the invention, the minimum process pitch is exemplified by 25 μm. The minimum process pitch refers to the smallest possible pitch between the traces that can be produced with current substrate manufacturing technology. In the substrate structure 202 of the present embodiment of the invention, the minimum pitch S2 between the trace 228(1) and the first metal tile 224(1) adjacent to the trace 228(1) also can be taken as the minimum process pitch, which is 25 μm. In other words, the metal structure for increasing structural strength of the substrate in the present embodiment of the invention can be closer to the traces than the conventional metal mesh wire used for increasing the structural strength of the substrate.

Figure 6:
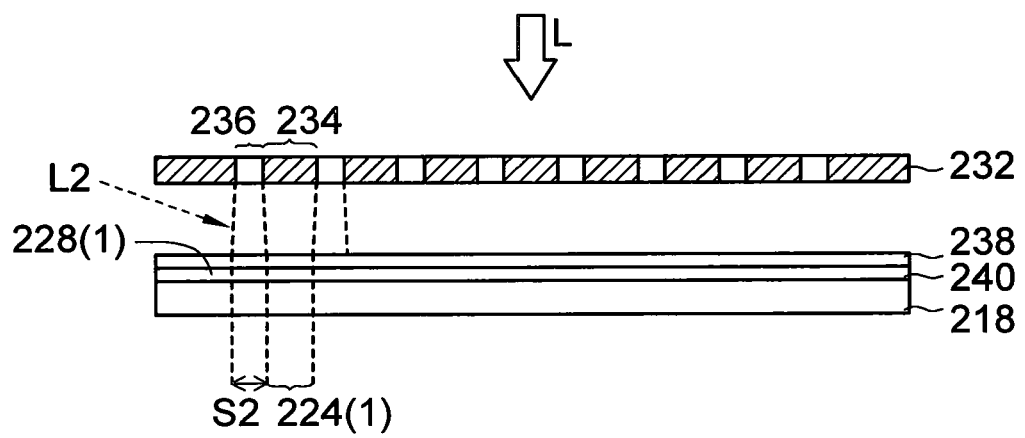
FIG. 6 shows the manufacturing of a first metal tile of FIG. 4.

Referring to FIG. 6, the manufacturing of a first metal tile of FIG. 4 is shown. During the manufacturing process of exposing and developing, a photo-resist layer 238 is exposed and developed. The shading region 234 of the mask 232 corresponds to a first metal tile 224(1) of FIG. 4. The first metal tile 224(1) is adjacent to a trace 228(1), and the transparent region 236 of the mask 232 corresponds to the pitch S2 of FIG. 4. Then, the metal layer 240 is etched so as to form the traces 228 and the first metal tiles 224 of the present embodiment of the invention. Referring to both FIG. 2 and FIG. 6. As the transparent region 236 of the mask 232 of the present embodiment of the invention is narrow, the light L2 passing through the transparent region 236 has very small diffractive range. Therefore, the pitch S2 of the present embodiment of the invention is much smaller than the pitch S1 of FIG. 2, and can be as small as the minimum process pitch, which is 25 μm. Thus, the distribution range of the first metal tiles 224 becomes wider, and this is conducive for increasing the structural strength of the substrate and controlling metal structure proportion. Besides, the second metal tiles 226 can also be formed on the second surface 220 by the technique disclosed in FIG. 6.

Figure 1:
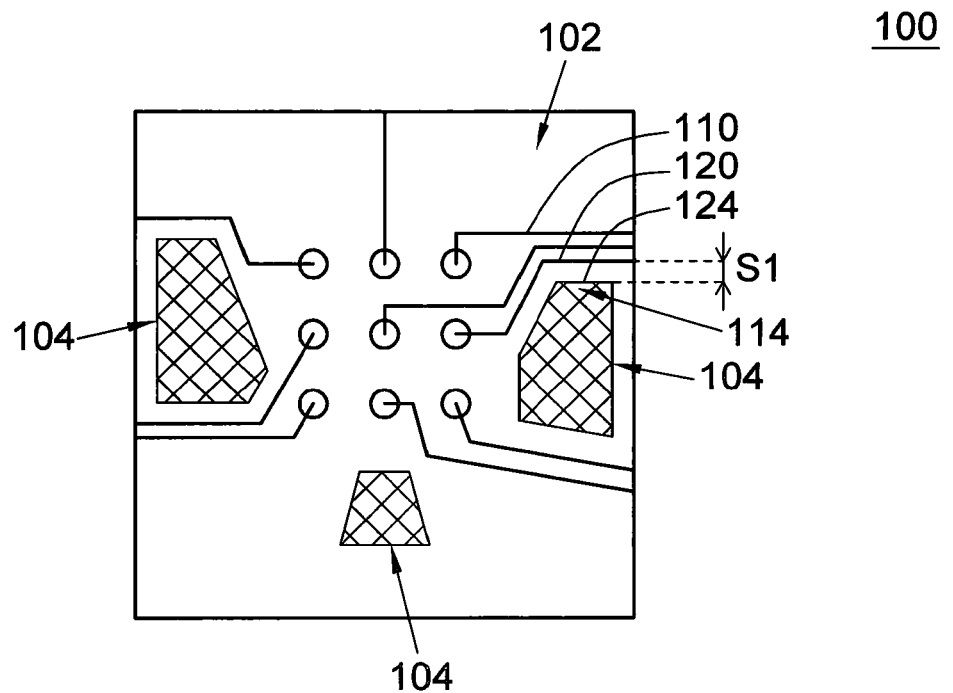
FIG. 1 (prior art) shows a conventional substrate structure.
Figure 2:
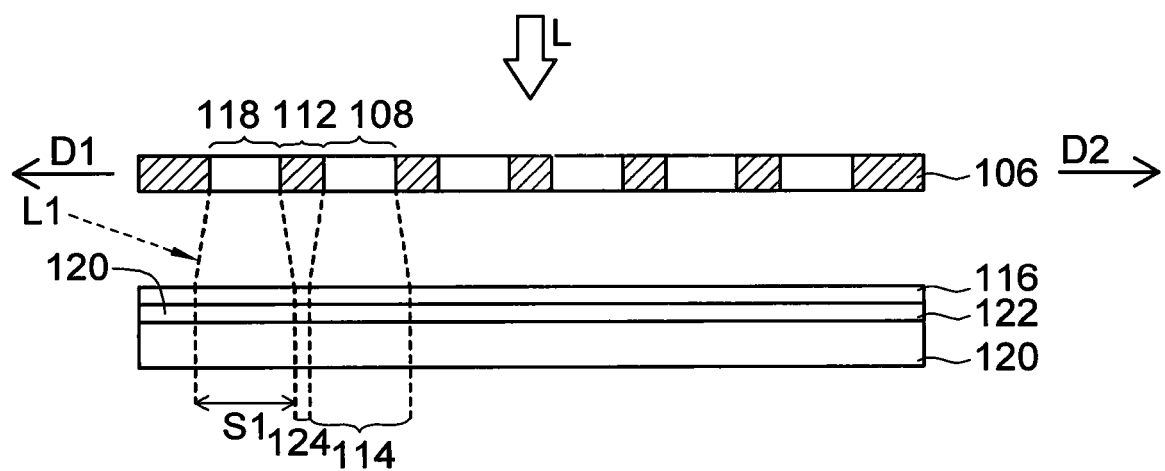
FIG. 2 (prior art) shows the manufacturing of a metal mesh layer of FIG. 1.

In the present embodiment of the invention, the width of the first metal tiles 224 and the second metal tiles 226 is wider than that of the conventional metal mesh wire of FIG. 2, and the pitch between adjacent two of the first metal tiles 224 and the pitch between adjacent two of the second metal tiles 226 are as small as the minimum process pitch. Therefore, the first metal tiles 224 and the second metal tiles 226 have a higher distribution density. As a result, for a given distribution range, the first metal tiles 224 and the second metal tiles 226 are superior to the convention metal mesh layer in that the structural strength of the substrate is increased. Besides, compared with the conventional metal mesh layer 104 of FIG. 2, in the present embodiment of the invention, the first metal tile 224(1) adjacent to the trace 228(1) can be even closer to the trace 228(1), so that the first metal tiles 224 have a larger distribution range, and this is conducive for controlling the metal structure proportions between the two opposite surfaces of the substrate core 218.

Furthermore, the substrate structure 202 may further include other metal components in addition to the abovementioned traces 228. Examples of the other metal components include a number of first electrically-functioning circuits disposed on the first surface 222 and a number of second electrically-functioning circuits disposed on the second surface 220. Like the traces 228, the first electrically-functioning circuit and the second electrically-functioning only have the function of electrical connection; they do not have the function of increasing the structural strength of the substrate structure. Examples of the first electrically-functioning circuit include a metal conductive layer disposed on the through holes 242 (e.g., a via pad as illustrated in FIG. 4), a metal pad for electrically connecting with the chip 204, or a ground/power plane. Examples of the second electrically-functioning circuit include a via pad, a metal pad for electrically connecting with the first conductive portions 212, a ground/power plane, and a metal line that connects the via pad and the metal pad. Note that the traces 228, the first metal tiles 224, and the first electrically-functioning circuit are formed simultaneously by etching the metal layer 240 disposed on the first surface 222 of the substrate core 218. In much the same way, the second metal tiles 226 and the second electrically-functioning circuit are formed simultaneously by etching a metal layer disposed on the second surface 220 of the substrate core 218. Due to functional or other requirements, the variation in distribution range, location and quantity of the first component, the second component, and the traces may increase the difference of the metal structure proportions between the two opposite surfaces of the substrate structure 202. However, with the formation of the first metal tiles 224 and the second metal tiles 226, the present embodiment of the invention brings the difference in the metal structure proportions between the two opposite surfaces of the substrate structure 202 down to be within 15%, thereby reducing the potential deformation when the substrate structure is operated at a high temperature.

To put it in greater details, all the structures made from metal materials and formed on the first surface 222 of the substrate structure 202 are constituted of the traces 228, the first metal tiles 224 and a number of first electrically-functioning circuits, and all the structures made from metal materials and formed on the second surface 220 are constituted of the second metal tiles 226 and a number of second electrically-functioning circuits. The cross-sectional areas of the traces 228, the first electrically-functioning and the first metal tiles 224 along the first surface 222 add up to a first area, and the cross-sectional areas of the second electrically-functioning circuits and the second metal tiles 226 along the second surface 220 add up to a second area. Through the techniques disclosed in the present embodiment of the invention, the difference between the first area and the second area can be easily controlled to be within 15%.

Besides, the present embodiment of the invention is also applicable to a multi-layered structure. The multi-layered structure is formed by a number of single-layered substrate structures being stacked together. If the difference in the metal structure proportions in the two opposite surfaces of the substrate structure is too large, then the accumulation of the difference in the metal structure proportions in the multi-layered structure would be tremendous. As a result, as the multi-layered structure is on working, the multi-layered structure might be damaged. To the contrary, in the present embodiment of the invention, the metal structure proportions between the two opposite surfaces of a single-layered substrate structure can be precisely controlled, so that the overall metal structure proportions in the multi-layered structure will be controlled to be within a safe range. Thus, the techniques of the invention effectively improve the strength of the multi-layered structure and reduce the deformation caused by high temperature.

Despite the chip of the present embodiment of the invention being exemplified by a flip chip, the invention is not limited thereto. The chip of the present embodiment of the invention can be a non-flip chip having a number of pads (not illustrated). The pads of the chip are electrically connected to the substrate through a number of bonding wires (not illustrated). The sealant can further be used for sealing the pads and the bonding wires.

Despite both the first surface and the second surface of the present embodiment of the invention having the metal tiles, the invention is not limited thereto. In another embodiment, the metal tiles are disposed on only one of the first surface and the second surface. For example, the metal tiles are disposed on the first surface or the second surface. In practical application, the metal tiles are disposed according to actual needs and are not restricted by the exemplification of the present embodiment of the invention.

Also, the present embodiment of the invention, the shapes of the arrangement of the first metal tiles 224 and the second metal tiles 226 are not limited to the exemplifications of FIG. 4 and FIG. 5. That is, the first metal tiles 224 and the second metal tiles 226 can be arranged in any shapes according to actual needs. For example, the first metal tiles 224 and the second metal tiles 226 can be arranged as a trapezoid, a circle or other shapes. For example, portions of the first metal tiles 224 of FIG. 4 are arranged as a circular area C, and portions of the second metal tiles 226 of FIG. 5 are arranged as a triangular area T.

According to the substrate structure and the package structure using the same disclosed in the above embodiments of the invention, a number of metal tiles are formed on a surface of the substrate structure, and the minimum pitch between adjacent two of the metal tiles can be the minimum process pitch of the substrate structure. Thus, the metal tiles have a higher distribution density and a wider distribution range, and this is conducive for increasing the structural strength of the substrate and controlling the metal structure proportions between the two opposite surfaces of the substrate structure. Moreover, the deformation in the substrate structure when operating in a high temperature and a package structure using the same is largely reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package structure, comprising:
a substrate structure, comprising:
a plurality of traces;
a substrate core having a first surface and a second surface opposite to the first surface;
a plurality of first metal tiles for increasing the strength of the substrate structure, wherein the first metal tiles and the traces are disposed on the first surface, the first metal tiles are in the shape of a polygon and arranged in a matrix, each one of the first metal tiles is separated from the other first metal tiles, the minimum gap between adjacent two of the first metal tiles is equal to 25 µm, and the minimum width of the first metal tiles is wider than the minimum gap between adjacent two of the first metal tiles;
a plurality of second metal tiles for increasing the strength of the substrate structure, the second metal tiles are disposed on the second surface;
a plurality of first electrically-functioning circuits disposed on the first surface; and
a plurality of second electrically-functioning circuits disposed on the second surface;
wherein, the traces, the first electrically-functioning circuits and the first metal tiles along the first surface add up to a first metal structure proportion, and the second electrically-functioning circuits and the second metal tiles along the second surface add up to a second metal structure proportion, and the difference between the first metal structure proportion and the second metal structure proportion is within 15%;
a chip electrically connected to the substrate structure; and a sealant for sealing the chip, wherein the first metal tiles are electrical isolated, the minimum gap between one of the traces and one of the first metal tiles is equal to 25 µm, and one of the traces is adjacent to one of the first metal tiles.

2. The package structure according to claim 1, wherein the minimum gap between adjacent two of the second metal tiles is equal to 25 µm.

3. The package structure according to claim 2, wherein each of the first metal tiles and each of the second metal tiles are made from copper.

4. The package structure according to claim 1, wherein one of the second metal tiles is a circle or a polygon.

5. The package structure according to claim 1, wherein one of the first metal tiles and one of the second metal tiles are in the shape of a rectangle, a side length of the rectangle is 100 µm, and the pitch between adjacent two of the first metal tiles is equal to 25 µm.

6. The package structure according to claim 1, wherein a peripheral side of the sealant is substantially aligned with a peripheral side of the substrate structure.

7. The package structure according to claim 1, further comprising:
  a plurality of first conductive portions disposed on the second surface for electrically connecting with a circuit board.

8. The package structure according to claim 1, wherein the chip is a flip chip, and the package structure further comprises:
  a plurality of second conductive portions disposed on the flip chip for electrically connecting with the substrate; and
  an underfill disposed between the flip chip and the substrate structure for sealing the second conductive portions;
  wherein, the sealant encapsulates the underfill.

9. The package structure according to claim 1, wherein the chip comprises a plurality of pads, and the package structure further comprises:
  a plurality of bonding wires for electrically connecting the pads and the substrate;
  wherein, the sealant encapsulates the pads and the bonding wires.

10. The package structure according to claim 1, further comprising a plurality of through holes on the first surface.

11. The package structure according to claim 1, wherein the traces are used for providing electrical connection.

12. The package structure according to claim 1, wherein the substrate further comprises a plurality of through holes on the first surface, and the first electrically-functioning circuits include a metal conductive layer disposed on the through holes.

13. The package structure according to claim 1, wherein the first electrically-functioning circuits include a first metal pad for electrically connecting with the chip.

14. The package structure according to claim 1, wherein the first electrically-functioning circuits include a ground/power plane.

15. The package structure according to claim 1, wherein the second electrically-functioning circuits include a via pad and a ground/power plane.

16. The package structure according to claim 7, wherein the second electrically-functioning circuits include a second metal pad for electrically connecting with the first conductive portions.

17. The package structure according to claim 16, wherein the second electrically-functioning circuits further include a via pad and a metal line for connecting the via pad and the second metal pad.

* * * * *